United States Patent
Florek et al.

(10) Patent No.: US 9,054,408 B2
(45) Date of Patent: Jun. 9, 2015

(54) REMOVABLE CARD FOR A CONTACTLESS COMMUNICATION, ITS UTILIZATION AND THE METHOD OF PRODUCTION

(75) Inventors: Miroslav Florek, Bratislava (SK); Michal Masaryk, Bratislava (SK)

(73) Assignee: Logomotion, S.R.O. (SK)

( * ) Notice: Subject to any disclaimer, the term of this patent is extended or adjusted under 35 U.S.C. 154(b) by 298 days.

(21) Appl. No.: 12/747,093
(22) PCT Filed: Aug. 10, 2009
(86) PCT No.: PCT/IB2009/053513
§ 371 (c)(1), (2), (4) Date: Jun. 9, 2010
(87) PCT Pub. No.: WO2010/023574
PCT Pub. Date: Mar. 4, 2010

(65) Prior Publication Data
US 2010/0258639 A1   Oct. 14, 2010

(30) Foreign Application Priority Data

Aug. 29, 2008  (SK) ........................................ 58-2008
Mar. 12, 2009  (SK) ................................. 50014-2009

(51) Int. Cl.
*H01Q 1/22* (2006.01)
*H01Q 7/06* (2006.01)
*G06K 19/077* (2006.01)

(52) U.S. Cl.
CPC ............. *H01Q 7/06* (2013.01); *Y10T 29/49016* (2015.01); *G06K 19/07732* (2013.01);
(Continued)

(58) Field of Classification Search
CPC .................. G06K 19/07749; G06K 19/07779; G06K 19/07783; G06K 19/0723; G06K 19/07732; G06K 19/0775; G06K 19/07771; G06K 19/07784; G06K 7/10336; G06K 19/0726; G06K 19/07769; G06K 19/07745; G06K 19/07781

USPC ............... 235/451, 492; 340/10.1, 10.3, 10.4, 340/572.1
See application file for complete search history.

(56) References Cited

U.S. PATENT DOCUMENTS 5,198,647 A * 3/1993 Mizuta .......................... 235/449
5,574,470 A    11/1996 de Vall
(Continued)

FOREIGN PATENT DOCUMENTS

CN    1450782    10/2003
CN    1627321    6/2005
(Continued)

OTHER PUBLICATIONS http://en.wikipedia.org/wiki/Permeability_(electromagnetism), printed Jan. 5, 2012.*
(Continued)

*Primary Examiner* — Christopher Stanford
(74) *Attorney, Agent, or Firm* — Baker & Hostetler LLP

(57) ABSTRACT

Removable card for a contactless communication contains an antenna (4) formed of threads (10) placed on the external surface of the body (1) of the card and covered by a layer (7) of a ferromagnetic material. In advantageous adjustment the antenna (4) contains on one area (2) of the card eight threads (10) and both areas (2) of the card are covered by a layer (7) of a ferritic foil. The antenna (4) is connected to the series with element (12) with capacity and the resistance (11) on the other side. Resonant circuit is tuned in for the final frequency from 13.0 to 15.0 MHz. The signal from the antenna (4) is read between the first and the second thread (10) from the side of the element (12) with capacity. The production method for the antenna on the body of the removable card resides in the fact that a groove of the conductive path (5) shape is dredged on the surface of the card's body (1), the groove is filled with a conductive material and a ferromagnetic material layer (7) is applied on the surface of the area (2) covering the antenna (4).

28 Claims, 5 Drawing Sheets

(52) U.S. Cl.
CPC ... *G06K 19/07749* (2013.01); *G06K 19/07771* (2013.01); *G06K 19/07779* (2013.01); *G06K 19/07783* (2013.01); *H01Q 1/2225* (2013.01); *H01Q 1/2275* (2013.01)

(56) References Cited

U.S. PATENT DOCUMENTS

| | | | |
|---|---|---|---|
| 5,608,417 | A | 3/1997 | de Vall |
| 6,062,472 | A | 5/2000 | Cheung |
| 6,070,795 | A | 6/2000 | Feiken |
| 6,070,796 | A | 6/2000 | Sirbu |
| 6,450,407 | B1 | 9/2002 | Freeman et al. |
| 6,615,243 | B1 | 9/2003 | Meggeid et al. |
| 6,745,935 | B1 | 6/2004 | Grieu et al. |
| 6,828,670 | B2* | 12/2004 | Hayama et al. ............... 257/700 |
| 6,963,317 | B2* | 11/2005 | Zuk et al. ..................... 343/895 |
| 6,976,011 | B1 | 12/2005 | Capitant et al. |
| 7,051,429 | B2* | 5/2006 | Kerr et al. ...................... 29/825 |
| 7,132,946 | B2* | 11/2006 | Waldner et al. ............ 340/572.1 |
| 7,364,092 | B2 | 4/2008 | Narendra et al. |
| 7,374,100 | B2 | 5/2008 | Jei et al. |
| 7,436,965 | B2 | 10/2008 | Sherman |
| 7,458,518 | B2 | 12/2008 | Fukuda et al. |
| 7,481,358 | B2 | 1/2009 | Honjo et al. |
| 7,568,065 | B2 | 7/2009 | D'Athis |
| 7,581,678 | B2 | 9/2009 | Narendra et al. |
| 7,689,932 | B2 | 3/2010 | Maktedar |
| 7,775,442 | B2 | 8/2010 | Saarisalo |
| 7,775,446 | B2* | 8/2010 | Ochi et al. .................... 235/492 |
| 7,805,615 | B2 | 9/2010 | Narendra et al. |
| 7,828,214 | B2 | 11/2010 | Narendra et al. |
| 8,055,184 | B1 | 11/2011 | DiMartino et al. |
| 8,127,999 | B2 | 3/2012 | Diamond |
| 8,355,670 | B2 | 1/2013 | White |
| 2001/0005832 | A1 | 6/2001 | Cofta et al. |
| 2002/0147658 | A1 | 10/2002 | Kwan |
| 2002/0163479 | A1 | 11/2002 | Lin |
| 2003/0057279 | A1* | 3/2003 | Uozumi et al. ............... 235/451 |
| 2003/0138135 | A1 | 7/2003 | Chung et al. |
| 2004/0066278 | A1 | 4/2004 | Hughes et al. |
| 2005/0011960 | A1* | 1/2005 | Koike et al. .................. 235/492 |
| 2005/0072595 | A1 | 4/2005 | Cho |
| 2005/0092835 | A1 | 5/2005 | Chung et al. |
| 2005/0116050 | A1 | 6/2005 | Jei et al. |
| 2005/0125745 | A1 | 6/2005 | Engestrom |
| 2005/0269401 | A1 | 12/2005 | Spitzer et al. |
| 2005/0269402 | A1 | 12/2005 | Spitzer et al. |
| 2006/0083955 | A1 | 4/2006 | Kanouda et al. |
| 2006/0143578 | A1 | 6/2006 | Maktedar |
| 2006/0146023 | A1 | 7/2006 | Kidron |
| 2006/0152288 | A1 | 7/2006 | Peng et al. |
| 2006/0186209 | A1 | 8/2006 | Narendra et al. |
| 2006/0219776 | A1 | 10/2006 | Finn |
| 2006/0226217 | A1 | 10/2006 | Narendra et al. |
| 2006/0255160 | A1 | 11/2006 | Winkler |
| 2007/0014407 | A1 | 1/2007 | Narendra et al. |
| 2007/0014408 | A1 | 1/2007 | Narendra et al. |
| 2007/0016957 | A1 | 1/2007 | Seaward et al. |
| 2007/0106564 | A1 | 5/2007 | Matotek et al. |
| 2007/0125840 | A1 | 6/2007 | Law et al. |
| 2007/0152035 | A1 | 7/2007 | Adams et al. |
| 2007/0158438 | A1 | 7/2007 | Fukuda et al. |
| 2007/0171079 | A1 | 7/2007 | Saito |
| 2007/0192840 | A1 | 8/2007 | Pesonen |
| 2007/0233615 | A1 | 10/2007 | Tumminaro |
| 2007/0235539 | A1 | 10/2007 | Sevanto et al. |
| 2007/0241180 | A1 | 10/2007 | Park et al. |
| 2007/0293155 | A1 | 12/2007 | Liao |
| 2008/0011833 | A1 | 1/2008 | Saarisalo |
| 2008/0048036 | A1 | 2/2008 | Matsumoto et al. |
| 2008/0051122 | A1 | 2/2008 | Fisher |
| 2008/0059375 | A1 | 3/2008 | Abifaker |
| 2008/0093467 | A1 | 4/2008 | Narendra et al. |
| 2008/0111756 | A1* | 5/2008 | Ochi et al. .................... 343/788 |
| 2008/0120129 | A1 | 5/2008 | Seubert et al. |
| 2008/0129629 | A1* | 6/2008 | Kimura et al. ................ 343/788 |
| 2008/0207124 | A1 | 8/2008 | Raisanen et al. |
| 2008/0233906 | A1 | 9/2008 | Mitomo et al. |
| 2008/0238610 | A1* | 10/2008 | Rosenberg .................... 340/5.7 |
| 2008/0270246 | A1 | 10/2008 | Chen |
| 2009/0065571 | A1 | 3/2009 | Jain |
| 2009/0065572 | A1 | 3/2009 | Jain |
| 2009/0069049 | A1 | 3/2009 | Jain |
| 2009/0069050 | A1 | 3/2009 | Jain et al. |
| 2009/0069051 | A1 | 3/2009 | Jain et al. |
| 2009/0069052 | A1 | 3/2009 | Jain et al. |
| 2009/0070272 | A1 | 3/2009 | Jain |
| 2009/0070691 | A1 | 3/2009 | Jain |
| 2009/0070861 | A1 | 3/2009 | Jain |
| 2009/0088077 | A1 | 4/2009 | Brown et al. |
| 2009/0098825 | A1 | 4/2009 | Huomo et al. |
| 2009/0108063 | A1 | 4/2009 | Jain et al. |
| 2009/0119190 | A1 | 5/2009 | Realini |
| 2009/0124273 | A1 | 5/2009 | Back |
| 2009/0143104 | A1 | 6/2009 | Loh et al. |
| 2009/0157936 | A1 | 6/2009 | Goss et al. |
| 2009/0191812 | A1 | 7/2009 | Teruyama et al. |
| 2009/0193491 | A1 | 7/2009 | Rao |
| 2009/0199283 | A1 | 8/2009 | Jain |
| 2009/0200371 | A1 | 8/2009 | Kean et al. |
| 2009/0261172 | A1 | 10/2009 | Kumar et al. |
| 2009/0265544 | A1 | 10/2009 | Moona et al. |
| 2009/0265552 | A1 | 10/2009 | Moshir et al. |
| 2009/0287589 | A1 | 11/2009 | Fivel |
| 2009/0298540 | A1 | 12/2009 | Narendra et al. |
| 2009/0307139 | A1 | 12/2009 | Mardikar et al. |
| 2009/0307142 | A1 | 12/2009 | Mardikar |
| 2009/0319287 | A1 | 12/2009 | Hammad et al. |
| 2010/0012721 | A1 | 1/2010 | Jain et al. |
| 2010/0023449 | A1 | 1/2010 | Skowronek et al. |
| 2010/0044444 | A1 | 2/2010 | Jain et al. |
| 2010/0045425 | A1 | 2/2010 | Chivallier |
| 2010/0062808 | A1 | 3/2010 | Cha et al. |
| 2010/0063893 | A1 | 3/2010 | Townsend |
| 2010/0181377 | A1 | 7/2010 | Chen et al. |
| 2010/0197224 | A1 | 8/2010 | Lahdenniemi et al. |
| 2010/0203870 | A1 | 8/2010 | Hubinak et al. |
| 2010/0205432 | A1 | 8/2010 | Corda et al. |
| 2010/0213265 | A1 | 8/2010 | Narendra et al. |
| 2010/0262503 | A1 | 10/2010 | Florek et al. |
| 2010/0264211 | A1 | 10/2010 | Jain et al. |
| 2010/0274677 | A1 | 10/2010 | Florek et al. |
| 2010/0274726 | A1 | 10/2010 | Florek et al. |
| 2010/0323617 | A1 | 12/2010 | Hubinak et al. |
| 2011/0264543 | A1 | 10/2011 | Taveau et al. |
| 2011/0282753 | A1 | 11/2011 | Mullen et al. |

FOREIGN PATENT DOCUMENTS

| | | |
|---|---|---|
| CN | 1835007 | 9/2006 |
| CN | 1870012 | 11/2006 |
| CN | 101013903 | 8/2007 |
| CN | 101136123 | 3/2008 |
| CN | 101329801 | 12/2008 |
| CN | 101339685 | 1/2009 |
| CN | 101351819 | 1/2009 |
| DE | 10130019 A1 | 1/2003 |
| DE | 10 2005 026435 B3 | 12/2006 |
| DE | 10 2006 019628 | 10/2007 |
| DE | 10 2007 019272 A1 | 10/2007 |
| EP | 0704928 A2 | 4/1996 |
| EP | 601091 B1 | 12/1997 |
| EP | 1365451 A1 | 11/2003 |
| EP | 1450233 A2 | 8/2004 |
| EP | 1536573 | 6/2005 |
| EP | 1729253 | 12/2006 |
| EP | 1752902 A2 | 2/2007 |
| EP | 1752903 A2 | 2/2007 |
| EP | 1785915 A | 5/2007 |
| EP | 1943606 A2 | 7/2008 |
| EP | 2390817 | 11/2011 |
| FR | 0611189 | 9/1926 |
| FR | 0611190 | 9/1926 |
| GB | 2390509 A | 1/2004 |

(56) References Cited

FOREIGN PATENT DOCUMENTS

| | | |
|---|---|---|
| GB | 2424151 A | 9/2006 |
| GB | 2432031 A | 9/2007 |
| IE | 980562 | 2/2000 |
| JP | 2003-131808 | 5/2003 |
| JP | 2004-348235 A | 12/2004 |
| JP | 2005-284862 A | 10/2005 |
| JP | 2006-033229 | 2/2006 |
| JP | 2007-060076 A | 3/2007 |
| JP | 2007-166379 | 6/2007 |
| JP | 2007-304910 A | 11/2007 |
| JP | 2008-083867 A | 4/2008 |
| KR | 2002-0012738 | 2/2002 |
| KR | 2002-0051696 | 6/2002 |
| KR | 2002-0073106 | 9/2002 |
| KR | 2003-0005088 A | 1/2003 |
| KR | 2004-0012401 A | 2/2004 |
| KR | 2004-0060249 | 7/2004 |
| KR | 2004-0089800 A | 10/2004 |
| KR | 2005-0008622 A | 1/2005 |
| KR | 2007-0093133 | 9/2007 |
| SI | 22595 | 2/2009 |
| WO | WO 03/012717 A1 | 2/2003 |
| WO | WO 2005/057316 | 6/2005 |
| WO | WO 2005/086456 | 9/2005 |
| WO | WO 2006/009460 | 1/2006 |
| WO | WO 2007/076456 A | 7/2007 |
| WO | WO 2007105469 A1 * | 9/2007 ............... H01Q 1/22 |
| WO | WO 2007/136939 | 11/2007 |
| WO | WO 2008/012416 A2 | 1/2008 |
| WO | WO 2008/041861 A | 4/2008 |
| WO | WO 2008/063990 | 5/2008 |
| WO | WO 2008/105703 A1 | 9/2008 |
| WO | WO 2009/014502 | 1/2009 |
| WO | WO 2009/087539 | 7/2009 |
| WO | WO 2009/118681 | 10/2009 |
| WO | WO 2010/011670 | 1/2010 |
| WO | WO 2010/023574 | 3/2010 |
| WO | WO 2010/032215 | 3/2010 |
| WO | WO 2010/032216 | 3/2010 |
| WO | WO 2010/041245 | 4/2010 |
| WO | WO 2010/044041 | 4/2010 |
| WO | WO 2010/097777 | 9/2010 |
| WO | WO 2010/122520 | 10/2010 |
| WO | WO 2010/128442 | 11/2010 |
| WO | WO 2010/131226 | 11/2010 |

OTHER PUBLICATIONS

"EMV Mobile Contactless Payment: Technical Issues and Position Paper", www.emvco.com/mobile.aspx, © Oct. 11, 2007, accessed Apr. 20, 2009, 37 pages.

"NFC Frequently Asked Questions," NFC for Customers, www.nfc-forum.org., Retrieved from the internet on Nov. 7, 2008, 5 pages.

Smart Card Alliance, "RF-Enabled Applications and Technology: Comparing and Contrasting RFID and RF-Enabled Smart Cards", Smart Card Alliance Identity Council, Jan. 2007, 7 pages.

Smart Card Alliance: "Proximity Mobile Payments: Leveraging NFC and the Contactless Financial Payments Infrastructure A Smart Card Alliance Contactless Payments Council White Paper", www.smartcardalliance.org, © Sep. 1, 2007, accessed Nov. 7, 2008, 10 pages.

"Intelligent Mouse", IBM Technical Disclosure Bulletin, International Business Machines Corp., Thornwood, US, Feb. 1, 1995, 38(2), p. 463.

Finkenzeller (Ed.), "RFID-Handbuch: Grundlagen und praktische Anwendungen Induktiver Funkanlagen, Transponder und kontaktloser Chipkarten", Jan. 1, 2002, 225-231 (English abstract attached).

Wikipedia, "Bluetooth", Wikipedia, The Free Encyclopedia, http://enwikipedia.org/wiki/bluetooth, accessed Apr. 8, 2012, 19 pages.

Wikipedia, "Cellular Frequencies" Wikipedia, The Free Encyclopedia, http://en.wikipedia.org/wiki/cellular_frequencies, accessed Apr. 8, 2012, 5 pages.

Madlmayar et al., "Management of Multiple Cards in NFC-Deivces", LNCS, 2008, 21 pages.

* cited by examiner

REMOVABLE CARD FOR A CONTACTLESS COMMUNICATION, ITS UTILIZATION AND THE METHOD OF PRODUCTION

CROSS-REFERENCE TO RELATED APPLICATIONS

This application is the National Stage of International Application No. PCT/IB2009/053513 filed Aug. 10, 2009, which claims the benefit of Slovak Application No. PP 00058-2008 filed Aug. 29, 2008, and Slovak Application No. PP 50014-2009 filed Mar. 12, 2009, the disclosures of which are incorporated herein by reference in their entirety.

FIELD OF INVENTION

The present invention relates to a removable, basically a flat card, in particular a memory card adjusted to a contactless radio communication, mainly NFC communication for the need of authorized processes executed by mobile communication devices. The invention also describes the utilization of the card and the method of production by means of adapting and supplementing a common construction of a removable card, mainly a memory card to a card with desired elements.

PRESENT TECHNOLOGY STATUS

Various memory card formats are widely used in a broad range of technical means such as digital cameras, mobile phones, computers. An appropriate slide in connector, slot in a device corresponds to a given standardized memory card format. Due to industrial production the removable memory cards are spread widely and the communication devices, mobile phones commonly contain an appropriate slot for a memory card insertion.

At the present, known are no such cards which, besides their common mainly memory function allow to raise the functionality of a supporting device by means of a contactless transmission channel. Such additional transmission channel is needed and desired to perform authorized operations, mainly at direct payments. Additional implementation of a conductive path for example in the format of NFC chip into existing and on the market widely spread and used mobile communication devices would significantly increase the frequency of direct payments executed by mobile communication devices.

The effort to create a room for a contactless communication element in already existing hardware space meets the problem residing in the antenna location in the way that it neither affects the external design, nor collides with other elements and still have sufficient conditions to receive and transmit the electromagnetic field.

The invention according to published patent JP2007166379 uses the antenna located directly on the external surface of the mobile phone. As for the existing mobile phones, such solution is unhandy and hardly useable. Solution according to CN1870012 contains an antenna inside a memory card. However, such adjustment is characterized by weak transmission attributes since the antenna is placed in a slide in slot of a mobile phone.

The French invention FR0611190 and FR0611189 describes a connection between the memory card and the antenna. However, there is no solution for a specific antenna adjustments and position and the antenna is not a part of the card itself. Many inventions such as CN101013903, U.S.2007/0158438A1, KR20040089800A, KR20030005088A and JP2004348235A describe connections and advantages of mobile phones capable to communicate with an additional antenna in short distance for example via NFC, RFID communication. However, those solutions do not describe the technical adjustments by which any additional and user acceptable functionality increase of the existing mobile communication devices can be executed.

The invention according to the file DE102007019272A1 describes a connection between an additional antenna and SIM card via a flexible antenna holder which should solve the spatial problem since the antenna exits outside the shaded room of a mobile phone. However, this solution is unsuitable for all-purpose use and complicates the manipulation with SIM card and the battery.

Other solutions as for example according to JP2007060076A use the battery body as an antenna system carrier which is hardly ever usable for additional mobile phone functionality increase. Known are also solutions where the antenna for NFC communication was created directly in the original hardware of the phone. Such technical solutions like KR20040012401A, KR20050008622A do not enable to equip the existing phones with an additional communication element.

Invention according to the file DE102005026435B3 and U.S.20060255160A1 describes a memory card containing, besides a chip also an antenna. This invention does not include a specific location of the antenna in the way that it is not shaded and has sufficient possibilities to receive and transmit the electromagnetic field after inserting the memory card into the slot of the supporting device. Such adjustment uses the location of an antenna element basically all over the card's area which in fact, worsens the transmission attributes.

BACKGROUND TO INVENTION

Disadvantages mentioned above are eliminated significantly by the removable card for a contactless communication consisting of a chip, basically a flat external body of the card made of electrically nonconductive material and card contacts which basis, according to this invention lies in the fact that the antenna comprises at least one thread of a conductive path on external nonconductive surface of the card's body and is at least partially overlaid by ferromagnetic material layer.

The location of the antenna and the creation of a conductive thread on the external surface of the body of the card improve the antenna attributes. Antenna's overlay by a ferromagnetic material layer solves the problem with card shading and stabilizes the antenna tuning.

After inserting into a slot of a particular device a substantial part of the card is electromagnetically shaded by metal pieces of the slot. Un-shaded remains mainly the cross-section of the entrance gap of which area is too small concerning the small thickness of the memory cards. Application of a ferromagnetic material on the card represents a significant element with suitable physical attributes in relation to signal transmission and of which areal spread creates conditions to control and forward the electromagnetic field from the surrounding towards the antenna on the card's surface. To gain desired receiving and transmission attributes it is suitable if the ferromagnetic material layer on the opposite side to the side of contacts reaches up to a marginal zone of the card's body area, preferably up to the edge of the card. From the technological point of view it is easy and suitable if the ferromagnetic material covers the whole area of the card apart from the contacts.

To maintain the standardized proportions of the removable cards within the stated tolerance should the sum of the superelevation height of the antenna's conductive path above the area surface of the card's external body and the thickness of the ferromagnetic material layer be no bigger than 0.15 mm, favorably up to 100 µm. Then it is possible to use the removable card according to this invention in slots of common removable memory cards with no necessity to develop and produce an external body of the card with special proportions. Ferromagnetic material relative permeability to the vacuum is from 30 to 180, favorably in a range from 50 to 150.

In advantageous adjustment the antenna is created on one surface of the card (upper or lower) by six to ten, favorably eight threads of the conductive path and both surfaces of the card are covered by a layer of a ferromagnetic material. In fact the antenna is placed between the two ferromagnetic material layers.

From the point of view of good transmission attributes it is appropriate if the conductive path threads have the width from 75 to 125 µm, favorably 100 µm. In one possible adjustment has the ferromagnetic material layer a form of a foil with the width from 75 to 125 µm, favorably 100 µm. Advantageous is if the ferromagnetic material layer consists of a ferritic foil for instance with the compound of ferric oxide $Fe_2O_3$, possibly $Fe_3O_4$ with the divalent metals.

As for solution with one antenna it is suitable if the threads are placed spirally on the area of a quadrilateral shape. From the technological point of view the corners of such structure will be curved. One side of the quadrilateral reaches up to the marginal zone of the card's body area on the opposite side to the side of contacts, preferably up to the edge of the card. It means that the antenna's edge is placed on that edge of the card's body which is, after inserting into an appropriate slot basically outside the slot, actually as close as possible to the external edge of the slot so in fact on the edge through which the card is taken out. The opposite side of the quadrilateral does not exceed two thirds, favorably the half of the card's body area height and the lateral sides of the quadrilateral reach up to marginal zones of the card's body area, preferably up to the edge of the card. Such adjustment allows a good use of such part of the card's area which contributes to a stabile electromagnetic wave transmission. Use of deeper located part of the card to hold the antenna's area can be unproductive or even worsening the total transmission attributes.

From the point of view of using a widespread microSD format of the cards advantageous is the adjustment when the described area of the antenna is of an orthogon shape, preferably a rectangle with the parameters of 3.5 mm to 6.5 mm times 6 mm to 10 mm, favorably 5 mm times 8.5 mm.

From the tuning point of view it is advantageous if the antenna is connected to the series with an element with capacity for instance a capacitor. This serial resonant circuit is tuned in for the frequency of 13.0 to 15.0 MHz after inserting the body of the card into an appropriate slot, favorably the frequency 14 MHz. Antenna is connected to the series with the resistance placed on the opposite side to the location of the element with capacity. The resistance is from 10Ω to 18Ω, favorably 14Ω. In contrast to the up to now used methods of processing the antenna signal is in the solution, according to this invention suitable if the signal is read between the first and the second thread from the side to which an element with capacity is connected to. The complex input impedance of the receiving circuit is $X_{f=14\ MHz}=4000\Omega-j2200\Omega$ at the frequency of 14 MHz.

The external body of the card is made of subsidized thermoplastic, preferably of a polymer type of PA6/6T and/or LCP and/or PBT and/or PET which creates a good condition to groove dredging with the sufficient adhesion of the conductive path to the groove surface. To reach an equal effect the body of the card can be at least covered with a layer of above mentioned materials on the places where the conductive path runs. The value of the used layer should reach at least the value of the conductive path height.

The removable card can have the adjustment containing two antennas shaped as a spiral induction coil located opposite on the card's body area outside the zone of contacts and the coins are joined through metallic gaps in the body of the card. On the card the connection is made on the place with no obstructions by inner elements of the card with original arrangement. Both areas of the card are covered by a ferromagnetic material reaching up to the edges of the card—to the end of the areas which are opposite to the zone of contacts. Ferromagnetic foils are found at the border of the entrance gap of the slot and are not electromagnetically shaded by the metal parts of the slot case. Such adjustment creates a funnel-shaped effect of electromagnetic field flow.

Other adjustment of the antenna's element is the solution when the conductive path of the antenna is across the circumference winded up on the card's body. The thread of the conductive path crosses the area of the card's body aslant and/or with the curvature continuous along the edge of the body of the card to the opposite area of the card's body from where crosswise to the other edge of the body of the card. According to the amount of the threads, this way it is repeatedly wind up onto the body of the card. The course of the conductive path on the surface of the card's body is vertical to the edge of the body of the card and needed movement of the neighboring threads is created on the edge of the card's body in a slope or curvature shape of the conductive path. Such adjustment creates an induction coil with the threads in both projections—vertical and parallel to the area of the card. Due to this construction it is possible to receive and transmit electromagnetic field in both mentioned directions. In case of problems with a contactless transmission of a signal via herein described removable card it is improvable if the mobile communication device is approached with the location of the removable card to the appropriate communication component for instance to POS terminal and the antenna is capable to process the electromagnetic field radiated directionally near the transmitter. To reach a good efficiency of the threads it is suitable if the across the circumference winded up conductive paths are mutually parallel.

When using two antennas the first contact of the first antenna is connected to a chip, the second contact of the first antenna is connected to grounding as well as to the first contact of the second antenna and the second contact of the second antenna is connected to a chip. The whole system has two near resonant frequencies due to which it is tuned in for a wider range. The range is needed considering the untuned system after inserting the card into a slot of the device. The demanded final frequency is 13.56 MHz. Such frequency can be received by antennas without external influence of the surrounding are tuned in a different frequency in a range from 13.4 MHz to 13.7 MHz, favorably from 13.5 MHz to 13.6 MHz.

To increase the functional attributes it is advantageous if the removable card is a memory card, favorably in microSD or SD or mini SD format.

The subject of protection according to this invention is by itself the utilization of the above described removable card in the mobile phone for creating a contactless link for payment applications with the use of a mobile phone.

Disadvantages of the present status are significantly eliminated also by a method of production of the antenna on the body of the removable card from the electrically nonconductive material according to this invention, of which the bottom line is that first a groove in the shape of a conductive path is dredged on the surface of the card's body, favorably by means of a laser beam. The thickness of the dredge cannot damage the integrity of the body of the card, usually does not exceed the depth from 0.005 mm up to 0.05 mm. Consequently, the groove is filled with a conductive material, favorable with an alloy containing gold since the contacts of the antenna are connected to a chip and on the surface or on the surface of the both areas is applied a ferromagnetic foil at least partially covering the antenna. It is suitable if the groove is filled in with a conductive material up to the height of the surrounding surface of the card.

To reach a good adhesive link of the conductive path with the body of the card and for easier groove dredging it is advantageous if the groove is dredged up to the layer of subsidized thermoplastic layer, favorably of PA6/6T and/or LCP and/or PBT and/or PET. It can be achieved by the choice of the basic material of the body of the card or by applying a layer of desired material on the surface of the body of the card before dredging the groove.

DESCRIPTION OF DRAWINGS

The invention is described in more details by means of FIGS. 1 to 7, where.

In a special view.

EXAMPLE OF APPLICATION

Example 1

Figure 1:
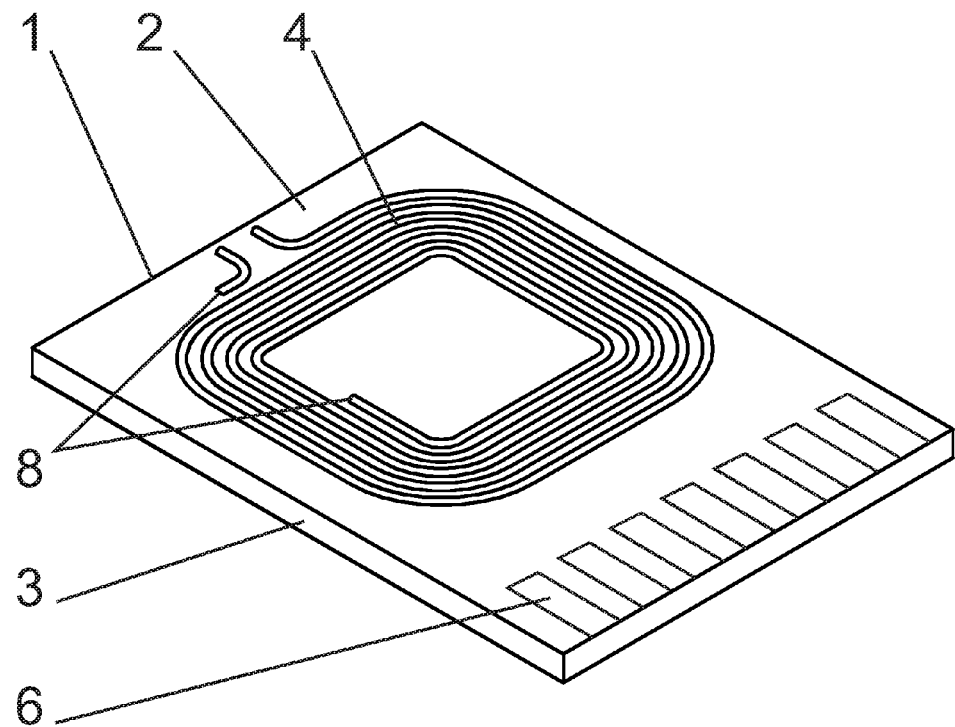
FIG. 1 shows a projection view at the removable card with two antennas on opposite areas.
Figure 2:
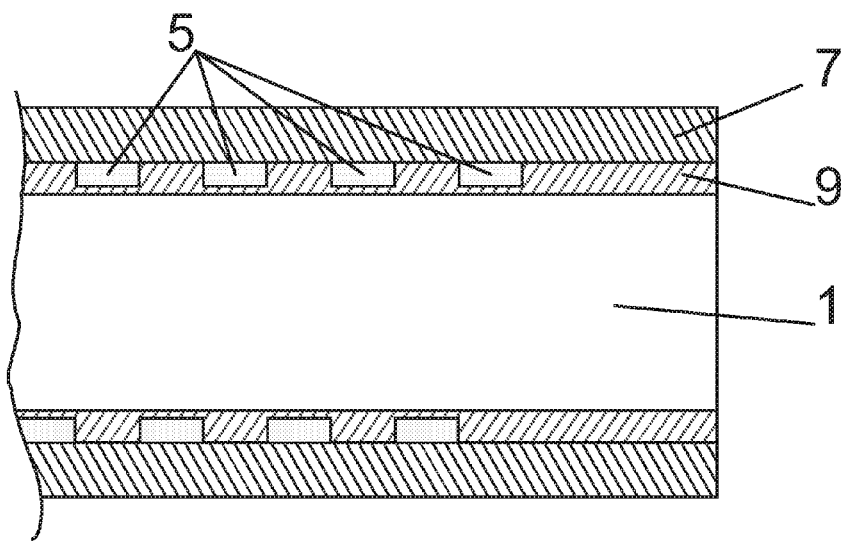
FIG. 2 is a cross section of the removable card with the illustration of layers and a conductive path.
Figure 3:
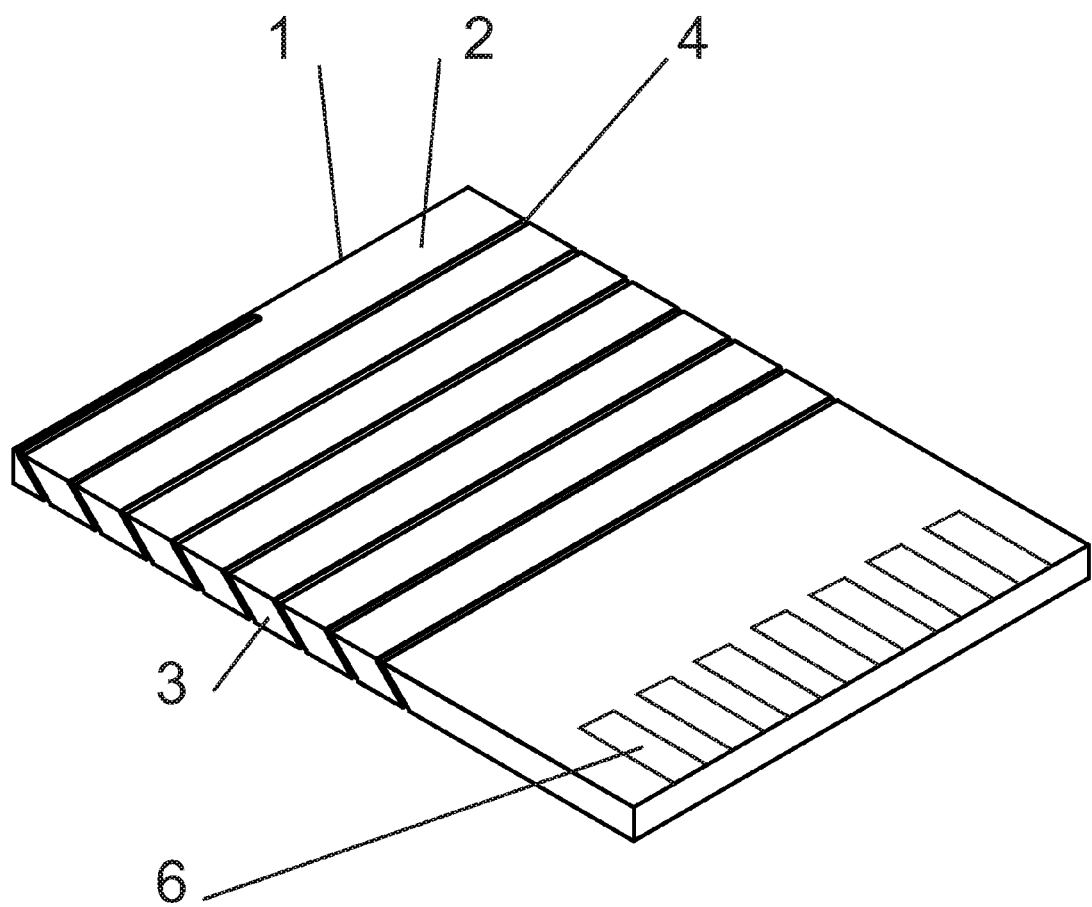
FIG. 3 shows a removable card with the across the circumference winding of the conductive path.
Figure 4:
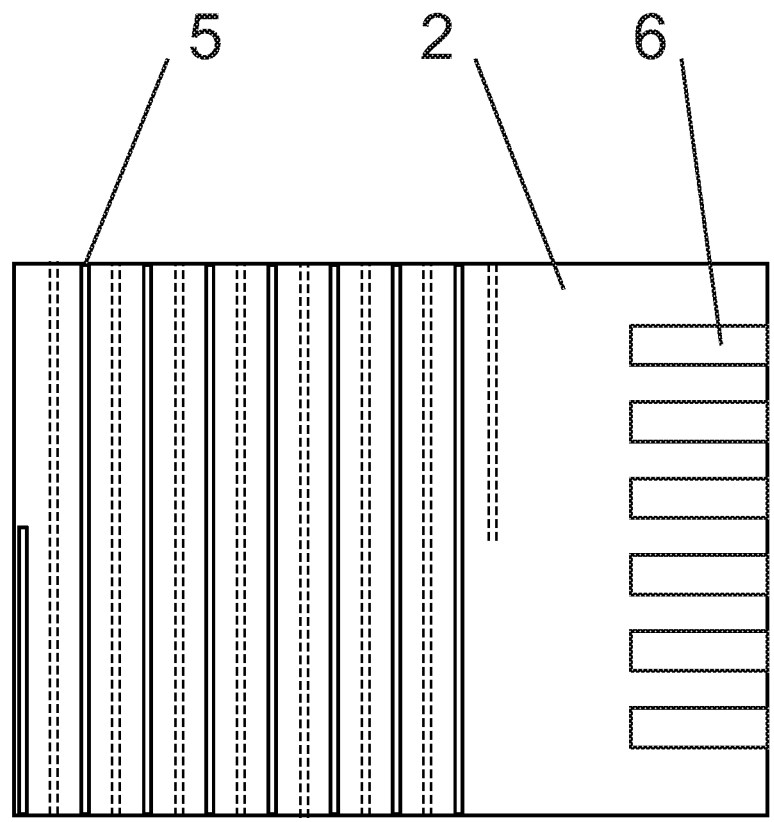
FIG. 4 represents an elevation and a profile view on the card with the across the circumference winding of the conductive path. The elevation shows a distinctive movement of the conductive path on one area against the parallel conductive path on the opposite area.
Figure 4:
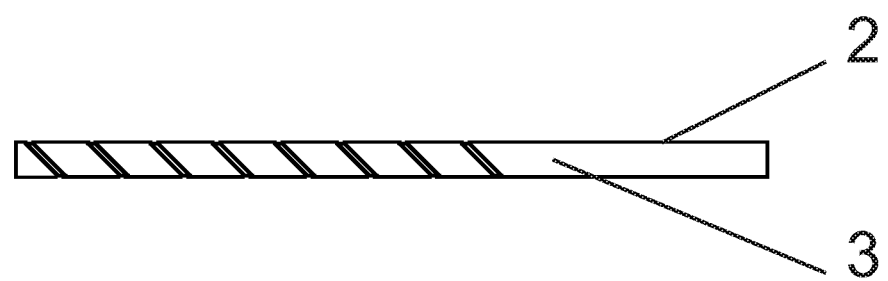
Figure 5:
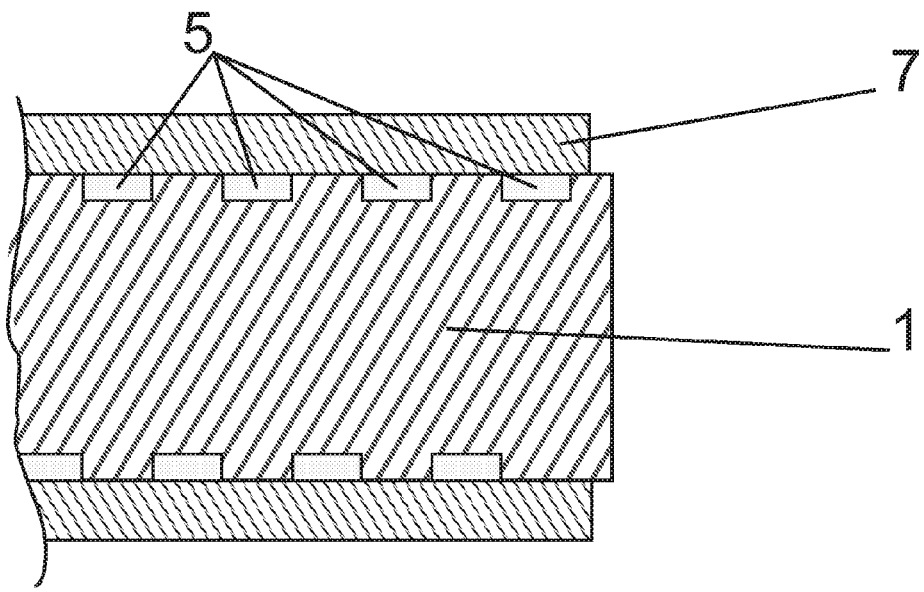
FIG. 5 shows a lengthwise section of a ferromagnetic material layer and the conductive path. For clearer illustration of the conductive path are FIGS. 3 to 5 with no scale and do not show the real number of windings according to related example.
Figure 6:
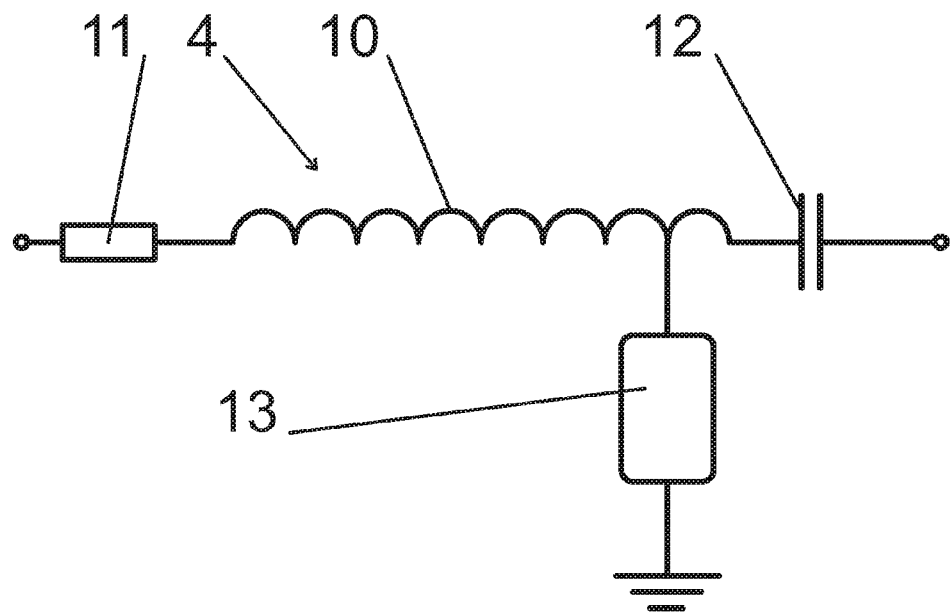
FIG. 6 represents a scheme of connection of a spiral induction with 8 threads showing also the connecting point between the antenna and the receiving circuit.
Figure 7:
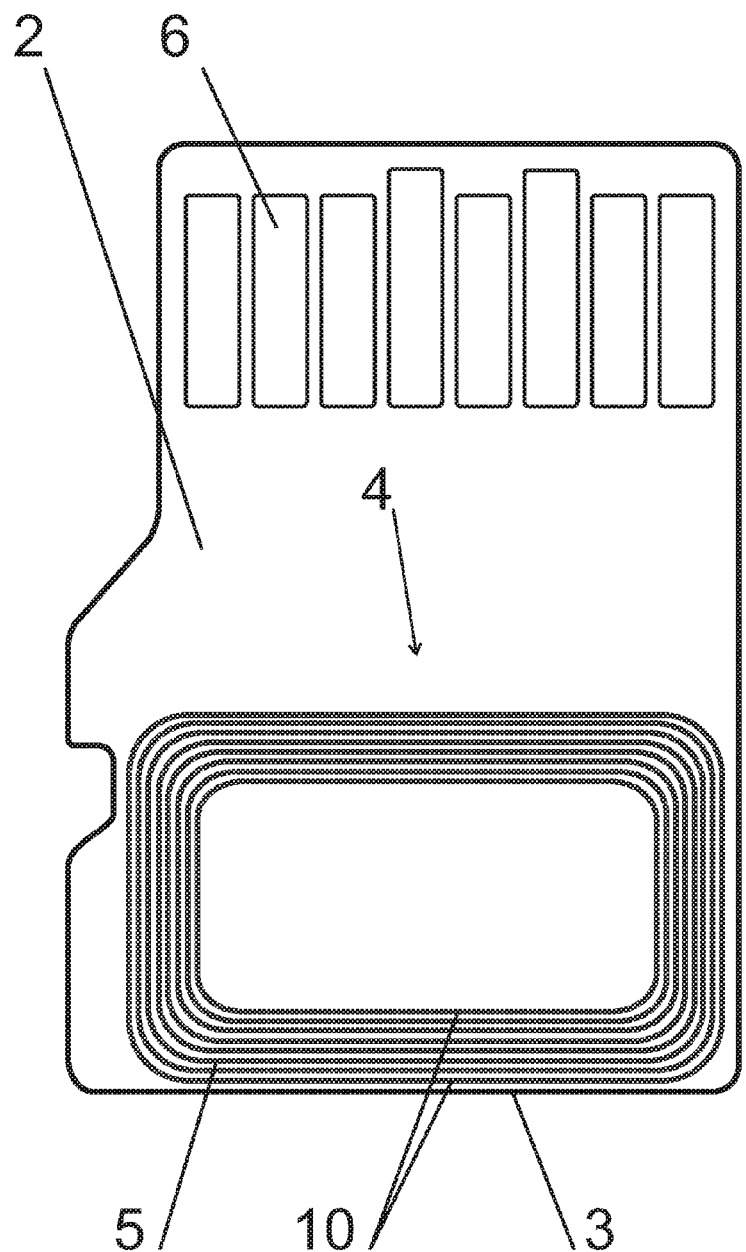
FIG. 7 shows microSD memory card with eight-thread-antenna on one area of the card.

This example describes a removable card of micro SD type with the parameters 15×11×0.7 mm with two antennas 4. There are on the areas 2 of the body 1 of the card, one tuned in a frequency of 13.5 MHz, second one tuned in a frequency of 13.6 MHz. Antenna's elements are made of spiral induction coils basically placed opposite on the areas 2 of the card. Coils are joined through metallic gaps 8 in the card on the body 1 of the card where the gap 8 with the joint is not an obstruction to inner elements of the card. The overall impedance attributes of the antenna 4 are set to have resonant frequency of 13.56 MHz after inserting into a slot of the mobile phone. By creating antenna 4 the adjustable parameter is the thickness of the conductive path 5, the size of the gap between the conductive paths 5 and the number of threads 10 of the coils. The first contact of the first antenna 4 is connected to exit contacts of the chip; the second contact of the first antenna 4 is connected to grounding as well as to the first contact of the second antenna 4. The second contact of the second antenna 4 is connected to other exit contact of the chip.

First, a layer 9 of PBT polymer type is applied on both areas 2 of the card. Consequently, a groove in a shape of a conductive path 5 is burnt in to the layer by laser on the areas 2 of the card. The conductive path 5 is created by fulfilling the shape groove by alloy of gold. Further are both areas 2 of the card provided with a layer 7 of ferromagnetic foil with the thickness of 0.05 mm. Relative permeability of the ferromagnetic foil in the vacuum is 50.

Example 2

According to schematic, scale-less pictures 3 to 5 the antenna 4 is winded up on the body 1 of the card by across the circumference winding. The body 1 of the card contains of LCP polymer type. The conductive path 5 crosses the area 2 of the body 1 of the card, in fact vertically to the edge 3 of the card. Further it continues aslant under 45 degree angle along the edge 3 of the body 1 of the card to the opposite area 2 of the body 1 of the card from where it leads across to the other edge 3 of the body 1 of the card and so it is repeatedly winded up onto the body 1 of the card. The conductive paths are mutually parallel, in this example with the width of 0.15 mm. Between the conductive path 5 winding on the upper area 2 and continuous winding on the lower area 2 is the movement of 0.7 mm. The slope of the conductive path 5 on the edge 3 of the body 1 of the card allows the movement of the continuation of the conductive path 5 on the opposite areas 2 of the card. The gap between the neighboring conductive paths on the area 2 of the card is in this example in a range between 0.1 mm to 0.15 mm. The height of the conductive path 5 is 0.03 mm. In this example the antenna 4 contains of 35 windings of the conductive path 5 which start at the edge 3 opposite to the side with contacts 6 and the windings finish approximately 5 mm from the opposite end of the card. The thickness of the ferromagnetic material layer 9 is 0.04 mm.

Example 3

A removable card in this example is a memory card with a body 1 of micro SD shape with parameters of approximately 15 mm×11 mm. It contains one antenna 4 created on one area 2 of the card. The antenna 4 consists of eight threads 10 and both areas 2 of the card are covered by a ferritic foil with the thickness of 100 μm with the antenna 4 is placed under the foil. Relative permeability of the ferritic foil is from 50-150. Covered are almost all the areas 2 of the card apart from the contact 6 zone.

Threads 10 are 100 μm wide with 100 μm wide gaps between the threads 10. The threads 10 of the antenna 4 are shaped into the borders of the rectangle with parameters of 5 mm×8.5 mm and with curved corners. The antenna 4 approaches with its three sides the marginal zones of the area 2 of the body 1 of the card. One side of the rectangle outlining the external borders of the antenna 4 reaches up to the marginal zone of the card's body 1 area 2 on the side opposite to the side of contacts 6, basically it reaches up to the edge 3 of the body 1 of the card. Two lateral sides of the rectangle outlining the external borders of the antenna 4 reach up to side marginal zones of the area 2 of the card's body 1. At the stated parameters of the antenna 4 in amount of 5 mm, the antenna 4 does not interfere even up to the half of the area 2 height of the card's body 1 and the upper border of the antenna 4 is app. 9 mm from that edge of the microSD card where the contacts 6 are placed.

Antenna 4 is connected to the series with the element 12 with capacity, herein as a capacitor. This serial resonant circuit is tuned in for the frequency of 14 MHz after inserting the body 1 of the card into an appropriate slot of the mobile phone. Antenna 4 is connected to the series with the resistance 11 while the resistance 11 is connected on the opposite side to the location of the element 12 with capacity. The value of the resistance is 14Ω. The receiving circuit 13 is connected to the antenna 4 between the first and the second thread 10 from the side to which an element 12 with capacity is connected. Signal from the antenna 4 is read between the first and the second thread 10 on the mentioned side. The complex input impedance of the receiving circuit 13 is $X_{f=14\ MHz}=4000\Omega-j2200\Omega$ at the frequency of 14 MHz.

The removable memory card according to this example is appointed to be used in a mobile phone. By inserting the card into an appropriate slot, originally appointed to memory extension and due to particular software equipment on the card as well as in a mobile phone a contactless link will be made between the mobile phone and external payment elements for the payment application with the use of a mobile phone.

INDUSTRIAL APPLICABILITY

Industrial applicability is obvious. According to this invention, it is possible to produce industrially and repeatedly removable cards for contactless communication mainly at the use of standards of NFC chips in the mobile communication devices containing a slot to insert a memory card in.

List of Related Symbols

1—a body of the card
2—an area of the card
3—an edge of the card
4—an antenna
5—a conductive path
6—contacts
7—a ferromagnetic material layer
8—a gap
9—a subsidized thermoplastic layer
10—a thread
11—resistance
12—an element with capacity
13—a receiving circuit

The invention claimed is:

1. A removable card adapted for insertion into a memory extension slot of a mobile communication device for creation of a contactless communication channel, the card comprising:
a flat card body made from an electrically nonconductive material, said card body having a first and a second external nonconductive surface on opposite sides of the card body;
an antenna made of at least one thread of a conductive path on the first external nonconductive surface of the card body, said antenna adapted to resonate at a resonant frequency;
a ferromagnetic material layer on at least said first external nonconductive surface of the card body and at least partially covering the antenna on an outer side of antenna relative to the card body; and
electrical contacts disposed on the first external nonconductive surface of the card body and adapted for connection in said slot of said mobile communication device,
wherein the ferromagnetic material layer is located on a portion of the first external nonconductive surface of the card body that is opposite to the portion of the card body on which the contacts are disposed, and wherein the ferromagnetic material layer extends to a margin of the first external nonconductive surface of the card body.

2. The removable card of claim 1, wherein the conductive path and the ferromagnetic material extend from the first external nonconductive surface of the card body by no more than 0.15 mm.

3. The removable card of claim 1, wherein the ferromagnetic material has a permeability relative to vacuum of 30 to 180.

4. The removable card of claim 3, wherein the ferromagnetic material has a permeability relative to vacuum of 50 to 150.

5. The removable card of claim 1, wherein the antenna has six to ten threads on the conductive path, and the first and second external nonconductive surfaces are covered with respective ferromagnetic material layers such that the antenna is disposed between the ferromagnetic layers.

6. The removable card of claim 1, wherein the threads of the conductive path are 75 to 125 μm wide, and gaps between adjacent threads are from 75 to 125 μm.

7. The removable card of claim 1, wherein the ferromagnetic layer is a foil having a thickness of 75 to 125 μm.

8. The removable card of claim 1, wherein the antenna is connected in series to a capacitive element, forming a resonant circuit that is tuned to a frequency of 13.0 to 15.0 MHz.

9. The removable card of claim 8, wherein the antenna is connected in series to a resistive element that is located opposite the capacitive element.

10. The removable card of claim 9, wherein the resistive element has a resistance of 10 to 18Ω.

11. The removable card of claim 8, wherein the antenna produces a signal that is read between a first thread, which is adjacent to the capacitive element, and a second thread, which is adjacent to the first thread.

12. The removable card of claim 1, comprising a receiving circuit having an initial complex impedance of $4000\Omega-j2200\Omega$ at a frequency of 14 MHz.

13. The removable card of claim 1, wherein the card body is made of a subsidized thermoplastic.

14. The removable card of claim 1, wherein at least the portions of the card body on which the conductive path is formed are covered with a layer from subsidized thermoplastic.

15. The removable card of claim 1, further comprising a second antenna adapted to resonate at a second resonant frequency, and wherein the antennas form spiral induction coils that are located on opposite sides of the card body, the induction coils being connected to one another through holes in the card body.

16. The removable card of claim 1, wherein the conductive path is wound circumferentially around the card body such that the thread runs across the first external nonconductive surface of the card body, and then continues along a first edge of the card body to a second external nonconductive surface of the card body that is opposite to the first external nonconductive surface of the card body, and then along a second edge of the card body that is opposite to the first edge of the card body, and back to the first external nonconductive surface of the card body.

17. The removable card of claim 1, wherein the conductive path is repeatedly wound circumferentially around the card body such that the circumferentially wound conductive paths are parallel to one another.

18. The removable card of claim 1, further comprising a microprocessor and a second antenna adapted to resonate at a second resonant frequency, wherein the first antenna has a first contact that is connected to the microprocessor, and a second contact that is connected to ground, and wherein the second antenna has a first contact that is connected to the microprocessor.

19. The removable card of claim 18, wherein the antennas are tuned to different resonant frequencies in the range of 13.4 to 13.7 MHz.

20. The removable card of claim 1, wherein the card is a removable memory card for a mobile communication device.

21. A method for effecting an electronic payment authorization, the method comprising:
using a mobile communication device having a removable card as recited in claim 1 to authorize a payment transaction at a point-of-sale terminal via a contactless communication channel between the mobile communication device and the point-of-sale terminal.

22. The removable card of claim 1, wherein said resonant frequency is different from a telephone communications frequency of the mobile communication device whereby said contactless communication channel is a separate channel from a mobile communications channel of said mobile communication device.

23. A removable card adapted for insertion into a memory extension slot of a mobile communication device for creation of a contactless communication channel, the card comprising:
a flat card body made from an electrically nonconductive material, said card body having a first and a second external nonconductive surface on opposite sides of the card body;
an antenna made of at least one thread of a conductive path on the first external nonconductive surface of the card body, said antenna adapted to resonate at a resonant frequency;
a ferromagnetic material layer on at least said first external nonconductive surface of the card body and at least partially covering the antenna on an outer side of antenna relative to the card body; and
a plurality of threads disposed spirally on the first external nonconductive surface of the card body and a plurality of electrical contacts disposed on the first external nonconductive surface of the card body,
wherein the threads are contained within a rectangular perimeter, the perimeter defining a first side that extends into a margin of the first external nonconductive surface of the card body that is opposite a portion of the card body on which the contacts are disposed.

24. The removable card of claim 23, wherein the rectangle has a width of 3.5 to 6.5 mm and a length of 6 to 10 mm.

25. A method of forming an antenna on a removable card adapted for insertion into a memory extension slot of a mobile communication device for creation of a contactless communication channel, the card having a microprocessor and a flat card body made from an electrically nonconductive material, said card body having a first and a second external nonconductive surface on opposite sides of the card body, the method comprising:
forming a groove into the first external nonconductive surface of the card body;
filling the groove with an electrically conductive material to form an antenna in a conductive path on the first external nonconductive surface of the card body, the antenna adapted to resonate at a resonant frequency;
electrically connecting the antenna to the microprocessor;
at least partially covering the antenna with a ferromagnetic foil that is applied to the first external surface of the card body so as to at least partially cover the antenna on an outer side of the antenna relative to the card body; and
forming electrical contacts on the first external nonconductive surface of the card body, said electrical contacts being adapted for connection in said slot of said mobile communication device,
wherein the ferromagnetic foil is located on a portion of the first external nonconductive surface of the card body that is opposite to the portion of the card body on which the contacts are disposed, and wherein the ferromagnetic foil extends to a margin of the first external nonconductive surface of the card body.

26. The method of claim 25, wherein forming the groove comprises forming the groove to a maximum depth of 0.005 to 0.05 mm from the first external nonconductive surface of the card body, and wherein filling the groove comprises filling the groove with conductive material to the first external nonconductive surface of the card body.

27. The method of claim 25, further comprising:
covering the card body with a layer of subsidized thermoplastic before the groove is formed into the card body.

28. The method of claim 25, wherein said resonant frequency is different from a telephone communications frequency of the mobile communication device whereby said contactless communication channel is a separate channel from a mobile communications channel of said mobile communication device.

\* \* \* \* \*